United States Patent [19]

Tamura et al.

[11] Patent Number: 5,072,284
[45] Date of Patent: Dec. 10, 1991

[54] SOLID STATE IMAGE PICKUP DEVICE

[75] Inventors: Hiroshi Tamura; Ryuji Kondo; Jin Murayama, all of Kanagawa; Hideki Kosaka, Nagano, all of Japan

[73] Assignee: Fuji Photo Film Co., Ltd., Kanagawa, Japan

[21] Appl. No.: 576,101

[22] Filed: Aug. 31, 1990

Related U.S. Application Data

[63] Continuation of Ser. No. 436,987, Nov. 15, 1989, abandoned.

[30] Foreign Application Priority Data

Nov. 25, 1988 [JP] Japan .................. 63-296334
Feb. 15, 1989 [JP] Japan .................... 1-33589

[51] Int. Cl.[5] .................. H01L 23/04; H01L 23/08; H01L 23/14; H01L 23/30
[52] U.S. Cl. .......................... 357/74; 357/72
[58] Field of Search .............. 357/72, 73, 74, 80; 437/209, 214

[56] References Cited

U.S. PATENT DOCUMENTS 3,924,246 12/1975 Scherer .................. 357/73
4,105,861 8/1978 Hascoe ................... 357/74
4,760,440 7/1988 Bigler et al. ............ 357/74
4,763,407 8/1988 Abe ....................... 357/74
4,784,974 11/1988 Butt ...................... 357/73

FOREIGN PATENT DOCUMENTS 0627777 5/1980 Japan ..................... 357/80

Primary Examiner—Andrew J. James
Assistant Examiner—S. V. Clark
Attorney, Agent, or Firm—Sughrue, Mion, Zinn, Macpeak & Seas

[57] ABSTRACT

A solid state image pick-up device is provided in which a photoelectric conversion element is configured so that a light reception portion of the photoelectric conversion element is covered with a member of light transmissible glass. A frame, used as a package, is filled with synthetic resin by a potting method, and the synthetic resin is solidified so that the frame, the peripheral portions of the glass member, and the photoelectric conversion element are integrally combined with each other. By so doing, the light transmission property of the photoelectric element can be properly made, excellent moisture resistance can be obtained, and improved reliability of the device results.

8 Claims, 3 Drawing Sheets

SOLID STATE IMAGE PICKUP DEVICE

This is a continuation of application Ser. No. 07/436,987 filed Nov. 15, 1989, abandoned Oct. 1, 1990.

FIELD OF THE INVENTION

The present invention relates to a solid state image pickup device having a photoelectric converting function such as an image sensor, a phototransistor, etc. In particular, the present invention relates to a package structure suitable for a solid state image pickup device of this kind.

BACKGROUND OF THE INVENTION

As video appliances have become popular, demand has increased for image sensors such as CCDs, MOS CCDs, etc., of solid state image pickup devices. Conventionally, image sensors have been generally packaged using ceramics offering superior moisture resistance.

As the demand has increased as described above, however, image sensors have come to be used in a variety of configurations, and further it has become necessary to make the image sensor compact and lightweight. In order to satisfy the demand, therefore, and further in compliance with cost pressures, plastic packages have been used in place of ceramic packages.

Where plastic packages have been used for solid state image pickup devices having a large light reception portion such as image sensors, a unique problem must be solved.

Specifically, a solid state image-pickup device such as an image sensor, a phototransistor, a photodiode, or the like, performs photoelectric conversion on the basis of incident light, and the light reception portion thereof is transparently or light-transmissibly packaged.

In packaging the light reception portion with plastics, it is necessary that the package surface be smooth over the whole surface. If the package surface is not smooth or is damaged, scattering reflection of light occurs which scatters the light transmission.

Further, in pouring the synthetic resin, if dust is mixed in or if air bubbles occur, the quantity of light transmission is deteriorated. The scattering and decreased quantity of light transmission may be factors in disadvantageously reducing the sensitivity of the image sensor.

Moreover, it is necessary to improve moisture resistance in the device, a problem common to all semiconductor devices.

In the case where a plastic package is used in place of a ceramic package, it has been difficult to solve the problems described above.

Further, a photoelectric conversion element, including a bottom portion thereof, is integrally packaged with plastics except for its light reception portion. In this case, packaging often requires the use of a number of expensive metal molds.

While the above-mentioned package structure and package manufacturing method are suitable in producing a large quantity of photo semiconductor image pickup devices of the same structure, they require a number of expensive metal molds resulting in high production costs.

However, photo semiconductor image pickup devices are being used less than semiconductor devices such as amplifier circuits, comparators, etc. Further, as the performance, such as resolution, is improved, and as the devices are made smaller and lighter in weight, the devices have come to be used in a variety of ways.

By way of example, they have come to be used not only for video cameras but for medical appliances such as electronic endoscopes, and further for military devices.

In consideration of the increased used of such devices, it can be easily understood that not only is the function of such image sensors important but so are the external appearance and package structure thereof.

It is desirable to produce a small quantity and a variety of image sensors matched to the application for their intended use.

In the conventional structure and manufacturing method of image sensors, however, ceramics have not been suitable for the production of a small quantity and a variety of image sensors because a number of expensive metal molds are required.

Further, image sensors require a variety of clock pulses for image pickup, for pickup signal reading, and so on, and if functional improvement is desired (such as resolution) the number of external connection terminals for the supply of the clock pulses and for reading the pickup signal becomes large.

Conventional image sensors have a structure in which external connection terminals are provided on an outside surface of a package. Where the number of the terminals is increased, the intervals between the terminals becomes so narrow that an undesirable signal leakage, short circuit or erroneous mounting in soldering is likely to occur unless the package is large.

Further, good moisture resistance is required not only for image sensors but for all semiconductor devices, regardless of the package structure.

SUMMARY OF THE INVENTION

A first object of the present invention is to provide a semiconductor device which offers good light transmitting properties and superior moisture resistance.

A second object of the present invention is to provide a semiconductor device which can be produced at low cost so that the device can be matched to its application.

In order to achieve the above first object, according to the present invention, the photoelectric conversion element is configured so that a light reception portion of the photoelectric conversion element is covered with a member of light transmissible glass. A frame which is used as a package is filled with synthetic resin by a potting method, and the synthetic resin is solidified so that, for example, the frame, the peripheral portions of the glass member and the photoelectric conversion element are integrally combined with each other.

That is, by covering the light reception portion of the photoelectric element with, for example, a plate-like glass member, the light transmission property of the photoelectric element can be made properly. Moreover, the scattering of light transmission and damage on the surface of the photoelectric element can be reduced. Further, since the photoelectric conversion element, the glass member, and the frame of the package are integrally solidified with the synthetic resin, for example epoxy resin poured by the potting method, good moisture resistance can be obtained, resulting in improved reliability of the products.

In order to achieve the above second object, according to the present invention, the photoelectric conversion element is fixed on a copper-plated lamination plate of a predetermined size. A frame made of, for example synthetic resin, is fixed on the periphery of the photoelectric conversion element, and the frame is closed with a light transmissible material at a portion corresponding to the light reception surface of the photoelectric conversion element with a light transmissible material.

According to the present invention having a structure as described above, the package can be formed without using a number of expensive metal molds because the package of the photoelectric conversion element comprises a copper-plated lamination plate, a frame formed by working synthetic resin material and metal or the like, and a light transmissible member.

Accordingly, the number of working steps in forming the package can be reduced so that producing costs can be reduced. Production costs are further reduced since it is unnecessary to use metal molds for ceramics.

Further, since the sizes of the copper-plated lamination plate and the frame can be easily and inexpensively changed in accordance with mounting status and device functions, the production of a small quantity and a variety of products can be easily realized.

Further, by forming a coating on the surface of the wiring substrate, moisture resistance can be improved.

DETAILED DESCRIPTION OF THE INVENTION

Figure 1:
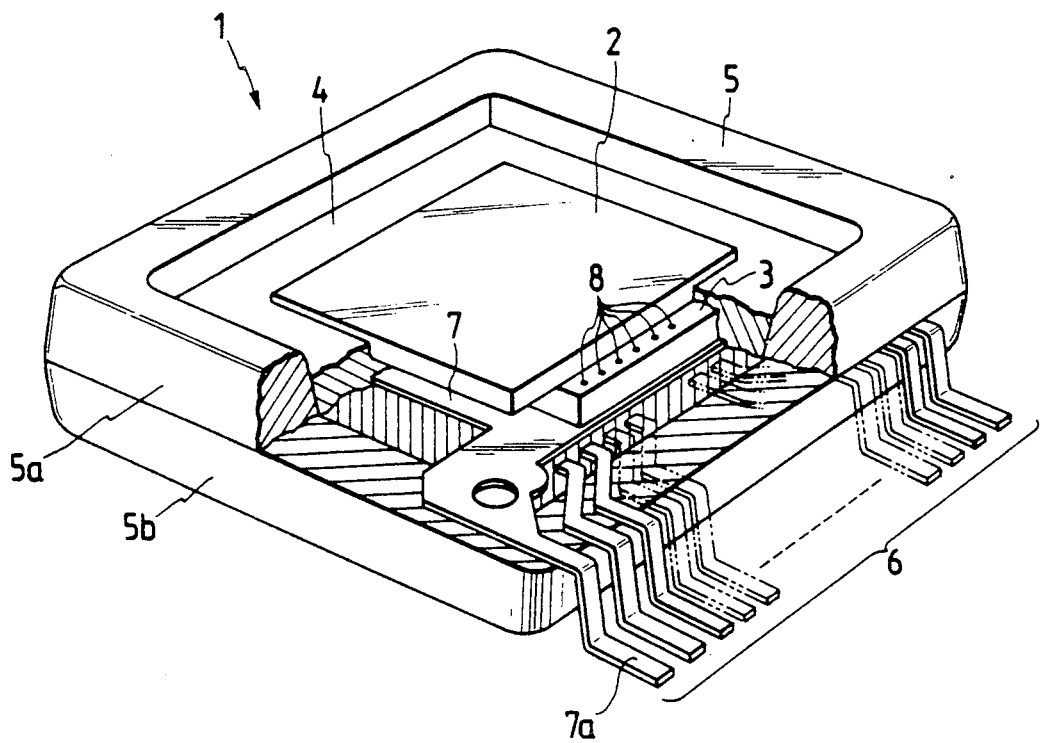
FIG. 1 is a partially cut-away perspective view showing the external appearance and structure of a first embodiment of the solid state image pickup device according to the present invention.

Referring to the drawings, embodiments of the semiconductor device according to the present invention are described as follows.

Figure 2:
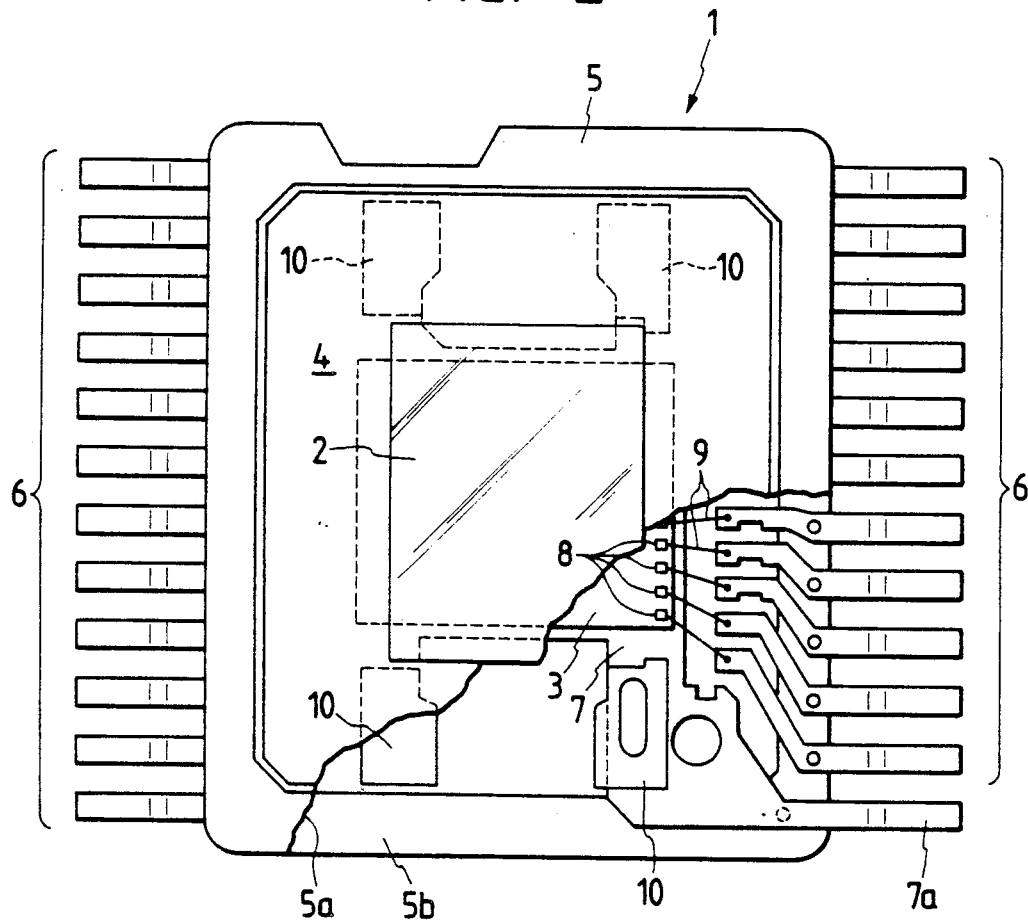
FIG. 2 is a partially cut-away plan view showing the positional relationship among the respective members of the solid state image pickup device of FIG. 1.

First, the external appearance of a solid state image pickup device 1 will be described with reference to FIGS. 1—3.

The solid state image pickup device 1 is an example of MOS-type image sensors and is provided in a package known in the art as a mini-flat package. The semiconductor device 1 has a light reception portion provided on its upper surface at a substantially central portion thereof, and is covered with a glass plate 2. The glass plate 2 is bonded at its lower surface to substantially the whole surface of a light reception surface of a photoelectric conversion element 3 through a transparent adhesive. The glass plate 2 is bonded at its outer periphery to synthetic resin 4 filled by the potting method and solidified.

The outer peripheral portion, having a high-level surface of the solid state image pickup device 1, is constituted by a frame 5 which is used as a package composed of an upper package 5a and a lower package 5b.

A number of leads 6 are external connection terminals of the photoelectric conversion element 3 and are led out from between the upper and lower packages 5a and 5b.

Although the lead portions outside the package and the lead portions inside the package are called outer leads and inner leads, respectively, by those skilled in the art, all the leads will be simply referred to as "leads" in this embodiment for convenience.

The inside structure of the semiconductor device 1 is described as follows. The lower surface of the photoelectric conversion element 3 is fixedly bonded to a tab hung lead 7 at a substantially central portion in the package. This bonding is performed so as to be electrically conductive, and a lead 7a of the tab hung lead 7 is maintained at a predetermined potential to thereby ensure stable operation. Further, bonding pads 8 of the photoelectric conversion element 3, in other words, the external connection terminals, are respectively connected to the top ends of the respective leads 6 through bonding wires 9 as shown in FIGS. 2 and 3.

The glass plate 2 is bonded onto the upper portion of the thus fixed photoelectric conversion element 3 as described above. At this time, the four corners of the glass plate 2 are prevented from being displaced transversely by positioning members 10.

Figure 3:
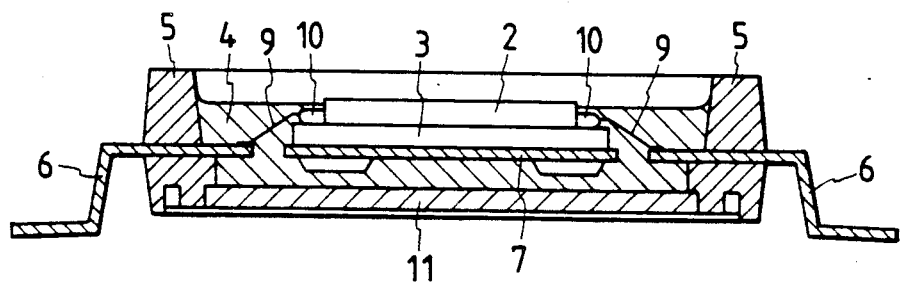
FIG. 3 is a sectional view of a main portion of the solid state image pickup device of FIG. 1.

As shown in FIG. 3, the lower portion of the package 5 is covered with a plate-like cover 11. The cover 11 vents synthetic resin 4 from flowing out when filling of the synthetic resin 4 is carried out by the potting method.

When the packages 5a and 5b, the photoelectric conversion element 3, the glass plate 2, the cover 11, etc. have been integrated with each other, and the wire bonding has been performed, the photoelectric conversion element 3 is as though it is suspended at the central portion of the box-shaped body. In this state, the upper space of the box-shaped body is open, and is filled with the synthetic resin 4 in a liquid phase through the opening of the upper space by the potting method.

Being in a liquid phase during potting, the synthetic resin 4 permeates the space in the box-shaped body so that even fine spaces are filled with the synthetic resin. However, since the potting method is not a press forming method, the force exerted on the fine bonding wires is so small that the possibility of undesired contact due to so-called wire flow can be reduced.

The materials of the various members constituting the solid state image pickup device 1 are described hereunder.

Taking the size of the package and the number of the lead terminals into consideration, a 42-alloy material having a plate thickness of 0.15 mm was used for the lead frame which became the leads 6 and the tab hung lead 7, and the whole surface of the lead frame was plated with 4 μm thick Ag.

As to the package 5, the material used requires consideration of at least the dimensional reliability and accuracy, the heat resistance in the assembling step, the heat resistance in mounting the solid state image pickup device 1 on the printed wiring substrate (not shown), the coefficient of thermal expansion, and the mechanical strength.

The synthetic resin used in this embodiment for molding the package 5 and the cover 11 was VECTRA-A-410 made by POLYPLASTICS Co. Epoxy resin in a liquid phase having a good adhesive qualities was used as the synthetic resin 4 added by the potting method.

In the solid state image pickup device 1 having a configuration as described above, since the glass plate 2 offers superior light transmission and has high surface hardness, the quantity of light received by the photoelectric conversion element 3 is even so that it is possible to carry out a photoelectric conversion operation with less sensitivity to scattering. Since the outer periphery and a part of the lower side surface of the glass plate 2 are integrated with epoxy resin having good adhesive qualities, moisture will hardly penetrate to the photoelectric conversion element 3 along the boundary surface between the glass plate 2 and the epoxy resin 4 is formed. Accordingly, the moisture resistance of the whole solid state image pickup device 1 is improved. Further, not only because the package is a mini-flat package, but also because the leads are formed in a bent shape for facilitating solder dipping, the mounting of the solid state image pickup semiconductor device 1 onto a wiring substrate is facilitated so that the number of working steps can be reduced.

More noticeably, because the four corners of the glass plate 2 are positionally restricted by the positioning members, defective products due to displacement are reduced, and the potting process is improved.

Although the embodiment of the present invention has been described above, the present invention is not limited to the described embodiment, but the embodiment can be modified in a variety of ways.

For example, the synthetic resin filled by the potting method may be colorless and transparent, or may be black in color. In the case of colored synthetic resin, light received through diffraction can be reduced.

Further, a color filter may be used in place of the glass plate to thereby perform color image pickup.

Further, a prism or the like may be used in place of the glass plate.

The present invention is widely applicable to any other solid state image pickup device in addition the image sensor described above. For example, the invention can be applied to semiconductor devices for performing photoelectric conversion such as phototransistors.

As described above, in the first embodiment of the solid state image pickup device according to the present invention, the light reception portion of the photoelectric conversion element is covered with glass, and the periphery of the glass and the frame which is used as a package are integrally fixed to each other with the synthetic resin filled by the potting method.

In the configuration described above, since glass is used which offers superior light transmission characteristics, the degree of transmission of light incident on the light reception portion can be made suitable. In other words, the transmission of light incident on the light reception portion can be made uniform, so that it is possible to perform photoelectric conversion having less sensitivity to scattering.

Further, since the adhesive characteristic at the boundary surface between the glass and the synthetic resin is superior, no moisture invading path is formed on the boundary surface. Accordingly, the permeation of water and humidity is reduced, and moisture resistance is improved.

Figure 4:
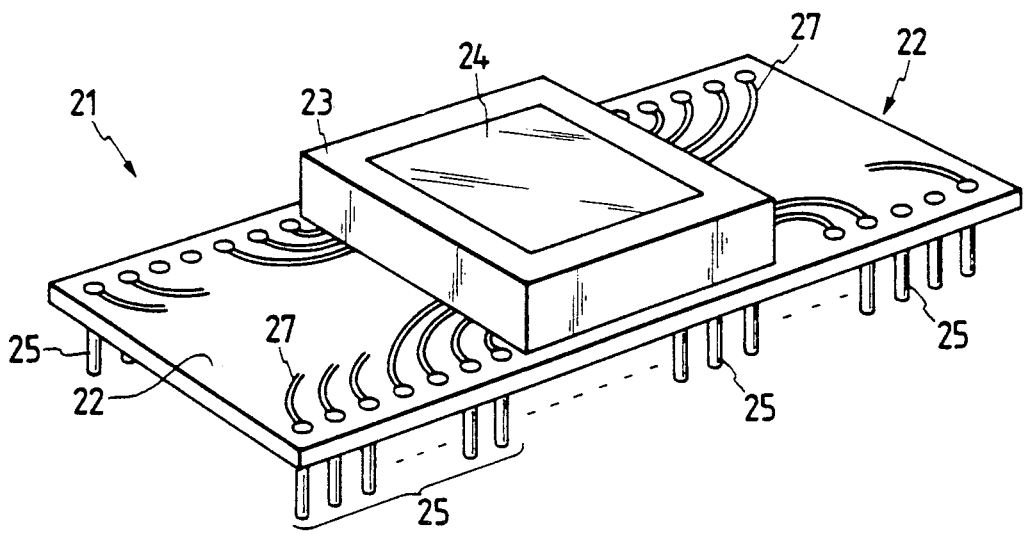
FIG. 4 is a perspective view showing the external appearance and structure of a second embodiment of the solid state image pickup device according to the present invention.
Figure 5:
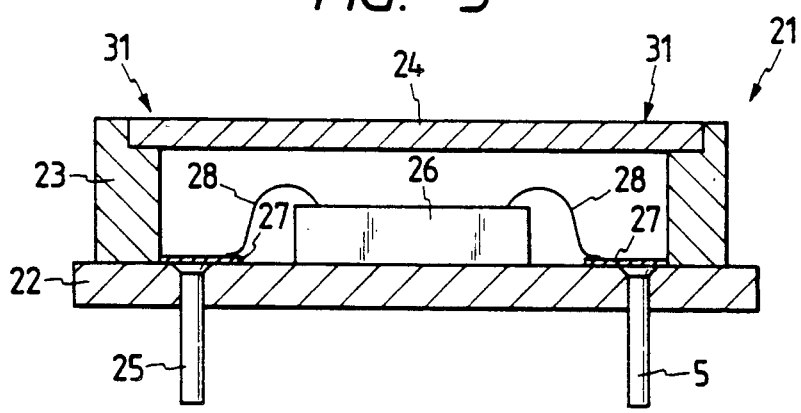
FIGS. 5 and 6 are sectional views of main portions of the inside structure of the solid state image pickup device of FIG. 4.

In the following description of a second embodiment, and referring to FIGS. 4-6, the external configuration and inside structure of an image sensor 21 is first described, and then a device for improving the moisture resistance of the image sensor is described.

The external configuration of the image sensor 21 is provided in a DIP type package, as it is known by those skilled in the art.

First, the external configuration of the image sensor 21 is described. The image sensor 21 is constituted by a frame 23 fixed at a substantially central portion of a copper-plated laminated plate 22 in which a 36 $\mu$m or a 18 $\mu$m thick copper foil layer is bonded on an insulating plate made of glass cloth in which resin, such as epoxy, is permeated. A glass plate 24 is provided to cover an upper opening portion of the frame 23.

External connection terminals 25 of the image sensor 21 are at predetermined intervals on the wiring substrate 22 at its longitudinal end portions.

Next, the inside structure of the image sensor 21 is described. A photoelectric conversion element 26 is fixed on the wiring substrate 22 at a substantially central portion thereof.

Bonding pads (not shown) of the photoelectric conversion element 26 are connected to circuit patterns 27 formed on the wiring substrate 22 though bonding wires 28, respectively.

The circuit patterns 27 are respectively connected to predetermined ones of the external connection terminals 25 to thereby deliver signals between the image sensor 21 and an apparatus on which the image sensor 21 is mounted.

The photoelectric conversion element 26 is electrically and conductively fixed on the circuit patterns, and the external connection terminals 25 connected to the circuit patterns are connected to a predetermined potential to thereby make the photoelectric conversion operation stable.

The frame 23 is made of synthetic resin and metal, and has a shape surrounding the periphery of the photoelectric conversion element 26. The bottom surface of the frame 23 is bonded to the writing substrate 22 with an adhesive such as epoxy which offers superior moisture resistance and adhesive properties.

Accordingly, the photoelectric conversion element 26 is surrounded by a box-shaped body constituted by the frame 23 and a part of the copper-plated laminated plate 22.

A stepped portion 31 is formed on the frame 23 at its upper opening portion so that the glass plate 24 of a light transmissible material is fitted onto the stepped portion 31.

The glass plate 24 is not only fitted onto the stepped portion, but is bonded to the stepped portion with the adhesive such as epoxy resin which offers superior moisture resistance properties.

Accordingly, a light receiving portion which is light-transmissible through the glass plate 24 is formed on a light reception surface (not shown) formed on the upper surface of the photoelectric conversion element 26 so that a photoelectric conversion operation is performed corresponding to the light incident from the photo receiving portion.

Although glass epoxy or a similar material is used in the copper-plated laminated plate 22, a part of the copper-plated laminated plate 22 is also used as the package of the photoelectric conversion element 26. Therefore, it is preferable to select the material which offers the most superior moisture resistance properties for the copper-plated laminated plate 22.

Figure 6:
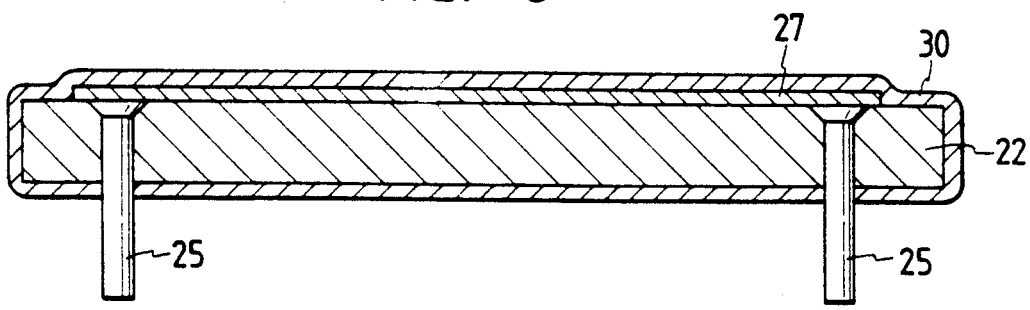

In this embodiment, the whole copper-plated laminated plate 22 is coated with a waterproof film 30, as shown in FIG. 6, so that moisture resistance can be improved not only on the copper-plated laminated plate 22, but also on the whole image sensor 21.

In the image sensor 21, since the intervals between the external connection terminals 25 can be made large, it is possible to reduce signal leakage between the terminals and short circuit in mounting.

Further, in the image sensor 21, it is possible to increase the number of pins while maintaining the widened intervals, for example in a PGA (pin grid array), by additionally providing further external connection terminals 25 at the inner side of the substrate.

The material of the various members constituting the image sensor 21 will be described hereunder.

The copper-plated laminated plate 22 is made of glass epoxy or the like formed on a flat plate. Copper, an alloy of copper and another conductor, or copper coated with a thin film of nickel, may be used for forming the circuit patterns 27. Further, the copper surface may be plated with solder.

Phosphor bronze or the like may be used for the external connection terminals 25, and the surface of the external connection terminals 25 may be plated with tin or the like.

The frame 23 may be made of synthetic resin or metal, which are integrally formed. Further, the frame 23 formed through machine working may be used.

As epoxy, MALON MEG-165 was used by the inventors.

Although the second embodiment of the present invention has been described above, the present invention is not limited to the described second embodiment, but may be modified. For example, the shape of the copper-plated laminated plate 22 may be modified to be matched to the shape of the apparatus on which the image sensor 21 is mounted.

The frame 23 is not limited to the shape described above but may, for example, be formed in the shape of a plane oval.

In the case where the frame 23 is formed in the shape of a plane oval, screw holes are formed in the frame 23 at positions away from the glass plate 24 so that the image sensor 21 itself is directly fixed to, for example, a casing of an electronic camera to thereby improve the mechanical strength. Further, the light transmissible material may be previously provided on the frame which is bonded to the copper-plated laminated plate after elements have been provided thereon. In either case, since the image sensor 21 shown in the embodiment can be manufactured extremely inexpensively in comparison with a ceramic package, and since it can be manufactured by machining, the dimensional accuracy can be greatly improved in comparison with the ceramic package.

Further, little deformation occurs, such as curves in the wiring substrate. Moreover, since phosphor bronze is used for the external connection terminals, the electric resistance can be made low.

Accordingly, an undesired voltage drop can be reduced so that noise is reduced and the signal level is prevented from becoming unduly low.

As described above, in the second embodiment of the solid state image pickup device according to the present invention, the package of the photoelectric conversion element is constituted by a part of a copper-plated laminated plate to which the photoelectric conversion element is fixed. The frame is fixed to the wiring substrate, and the light transmissible member, such as glass, is fixed to the frame.

In the above configuration, the package of the semiconductor device can be constituted without using a number of expensive metal molds, so that semiconductor devices such as image sensors or the like can be extremely inexpensively manufactured regardless of the number of desired products.

Fewer metal molds are used in this embodiment than in molding ceramics, and the metal molds used in the present invention can be produced more inexpensively than those for injection molding. Accordingly, small-quantity production and model change can be made easily, and manufacturing for a small quantity of several varieties of products can be inexpensively performed in accordance with the intended use.

What is claimed is:

1. A solid state image pickup device comprising:
   a copper-plated laminated plate;
   photoelectric conversion means having a light reception portion and attached to said copper-plated laminated plate for performing photoelectric conversion corresponding to a quantity of light incident on said light reception portion;
   a frame integrated with said copper-plated laminated plate, and having an area substantially smaller than that of said plate, and arranged so as to surround said photoelectric conversion means; external connection terminals fixed to said copper-plated laminated plate at locations both within and without an area surrounded by said frame, first circuit patterns on said plate and originating at external connection terminals at locations without said area surrounded by said frame, and second circuit patterns on said plate and originating at external connection terminals located within said area surrounded by said frame, and connected to said photoelectric conversion means by bonding wires; and
   light transmissible means integrated with said frame and arranged to cover said light reception portion of said photoelectric conversion means.

2. A solid state image pickup device as claimed in claim 1, wherein said copper-plated laminated plate comprises a copper foil layer 18 $\mu$m in thickness bonded on an insulating plate made of glass cloth in which resin is permeated.

3. A solid state image pickup device as claimed in claim 1, wherein said copper-plated laminated plate comprises a copper foil layer 36 $\mu$m in thickness bonded on an insulating plate made of glass cloth in which resin is permeated.

4. A solid state image pickup device as claimed in claim 1, wherein said photoelectric conversion means is a photoelectric conversion element.

5. A solid state image pickup device as claimed in claim 1, wherein said frame is made of a synthetic resin and metal.

6. A solid state image pickup device as claimed in claim 1, wherein said frame is square shaped.

7. A solid state image pickup device as claimed in claim 1, wherein said frame is matched to a shape of an apparatus on which said solid state image pickup device is mounted.

8. A solid state image pickup device as claimed in claim 1, wherein said frame is plane oval shaped.

* * * * *